(12) United States Patent
Ahgren

(10) Patent No.: US 9,167,342 B2
(45) Date of Patent: *Oct. 20, 2015

(54) ECHO SUPPRESSION

(71) Applicant: Microsoft Corporation, Redmond, WA (US)

(72) Inventor: Per Ahgren, Knivsta (SE)

(73) Assignee: Microsoft Technology Licensing, LLC, Redmond, WA (US)

( * ) Notice: Subject to any disclaimer, the term of this patent is extended or adjusted under 35 U.S.C. 154(b) by 302 days.

This patent is subject to a terminal disclaimer.

(21) Appl. No.: 13/784,715

(22) Filed: Mar. 4, 2013

(65) Prior Publication Data

US 2014/0177858 A1 Jun. 26, 2014

(30) Foreign Application Priority Data

Dec. 21, 2012 (GB) .................................. 1223241.9

(51) Int. Cl.
| | |
|---|---|
| *H04B 3/23* | (2006.01) |
| *H04R 3/00* | (2006.01) |
| *H04M 9/08* | (2006.01) |
| *G10L 21/0208* | (2013.01) |

(52) U.S. Cl.
CPC ............... *H04R 3/002* (2013.01); *H04M 9/082* (2013.01); *G10L 2021/02082* (2013.01)

(58) Field of Classification Search
USPC .................................. 370/201, 268, 286, 289
See application file for complete search history.

(56) References Cited

U.S. PATENT DOCUMENTS

| | | |
|---|---|---|
| 5,473,686 A | 12/1995 | Virdee |
| 6,256,383 B1 | 7/2001 | Chen |
| 6,466,666 B1 | 10/2002 | Eriksson |
| 6,549,587 B1 | 4/2003 | Li |
| 6,570,985 B1 | 5/2003 | Romesburg |
| 6,678,376 B1 | 1/2004 | Takahashi et al. |
| 6,914,978 B2 | 7/2005 | Huang et al. |
| 7,027,591 B2 | 4/2006 | Cairns |

(Continued)

FOREIGN PATENT DOCUMENTS

| | | |
|---|---|---|
| JP | 2009021741 A | 1/2009 |
| WO | 2004/064365 A1 | 7/2004 |

(Continued)

OTHER PUBLICATIONS

"Search Report", GB Application No. 1223238.5, May 29, 2014, 1 page.

(Continued)

*Primary Examiner* — Andrew Lee

(74) *Attorney, Agent, or Firm* — Danielle Johnston-Holmes; Micky Minhas

(57) ABSTRACT

Method, user device and computer program product for suppressing echo. An audio signal is output from a speaker. A microphone receives an audio signal, wherein the received audio signal includes an echo resulting from said outputted audio signal. A Finite Impulse Response filter estimate ĥ(t) is dynamically adapted in the time domain based on the outputted audio signal and the received audio signal to model an echo path h(t) of the echo in the received audio signal. At least one power response is determined from the filter estimate ĥ(t) and used to estimate the echo power of the echo in the received audio signal. The estimated echo power is used to apply echo suppression to the received audio signal, thereby suppressing the echo in the received audio signal.

20 Claims, 4 Drawing Sheets

(56) References Cited

U.S. PATENT DOCUMENTS

| | | | |
|---|---|---|---|
| 7,046,658 | B1 | 5/2006 | Kundaje et al. |
| 7,068,780 | B1 | 6/2006 | Levonas et al. |
| 7,082,123 | B2 | 7/2006 | Huang |
| 7,319,748 | B2 | 1/2008 | Stenger |
| 7,672,447 | B1 | 3/2010 | Lindqvist et al. |
| 8,111,840 | B2 | 2/2012 | Haulick et al. |
| 8,565,415 | B2 | 10/2013 | Schmidt et al. |
| 9,036,814 | B2 | 5/2015 | Sorensen |
| 2002/0126855 | A1 | 9/2002 | Terada et al. |
| 2002/0154761 | A1* | 10/2002 | McLaughlin et al. ... 379/388.01 |
| 2003/0140075 | A1* | 7/2003 | Lis .................. 708/322 |
| 2004/0057574 | A1 | 3/2004 | Faller |
| 2004/0111258 | A1* | 6/2004 | Zangi et al. ............ 704/226 |
| 2004/0161101 | A1 | 8/2004 | Yiu et al. |
| 2004/0252826 | A1* | 12/2004 | Tian et al. .............. 379/406.08 |
| 2005/0129226 | A1* | 6/2005 | Piket et al. ............ 379/406.01 |
| 2006/0126822 | A1* | 6/2006 | Schmidt et al. ........ 379/406.01 |
| 2006/0153359 | A1 | 7/2006 | Stenger |
| 2008/0085009 | A1 | 4/2008 | Merks et al. |
| 2008/0126461 | A1 | 5/2008 | Christoph |
| 2008/0275929 | A1* | 11/2008 | Callicotte et al. ............ 708/300 |
| 2009/0036170 | A1 | 2/2009 | Unno et al. |
| 2009/0109881 | A1* | 4/2009 | Li et al. .................. 370/280 |
| 2009/0245502 | A1* | 10/2009 | Liu .................. 379/406.08 |
| 2009/0245527 | A1* | 10/2009 | Kumar et al. ............... 381/66 |
| 2011/0170683 | A1 | 7/2011 | Lu et al. |
| 2011/0293104 | A1 | 12/2011 | Saplakoglu |
| 2012/0237047 | A1 | 9/2012 | Neal et al. |
| 2013/0216056 | A1 | 8/2013 | Thyssen |
| 2014/0177822 | A1 | 6/2014 | Sorensen |
| 2014/0177859 | A1 | 6/2014 | Ahgren |

FOREIGN PATENT DOCUMENTS

| | | | |
|---|---|---|---|
| WO | 2006/040734 | A1 | 4/2006 |
| WO | 2012105880 | A1 | 8/2012 |

OTHER PUBLICATIONS

"Search Report", GB Application No. 1223246.8, Apr. 30, 2014, 3 pages.

"Search Report", GB Application No. 1223241.9, Jul. 15, 2014, 3 pages.

"Final Office Action", U.S. Appl. No. 13/889,229, Sep. 19, 2014, 7 pages.

"International Search Report & Written Opinion for PCT Patent Application No. PCT/US2013/077353", Mailed Date: Mar. 6, 2014, Filed Date: Dec. 21, 2013, 9 Pages.

"International Search Report & Written Opinion for PCT Patent Application No. PCT/US2013/077355", Mailed Date: Apr. 2, 2014, Filed Date: Dec. 21, 2013, 10 Pages.

"International Search Report & Written Opinion for PCT Patent Application No. PCT/US2013/077354", Mailed Date: Mar. 18, 2014, Filed Date: Dec. 21, 2013, 10 Pages.

"Non-Final Office Action", U.S. Appl. No. 13/889,229, Mailed Date: May 2, 2014, 8 pages.

Enzner, et al., "Partitioned Residual Echo Power Estimation for Frequency-Domain Acoustic Echo Cancellation and Postfiltering", *European Transactions on Telecommunications vol. 13, Issue 2*, (Mar. 2002),12 pages.

Favrot, et al., "Modeling Late Reverberation in Acoustic Echo Suppression", *International Workshop on Acoustic Signal Enhancement 2012*, (Sep. 2012), 4 Pages.

Gupta, et al., "Nonlinear Acoustic Echo Control Using an Accelerometer", Retrieved at <<http://enpub.fulton.asu.edu/sensip/SenSIP_Papers/Non_linear_echo_cancellation.pdf>>, Proceedings of the 2009 IEEE International Conference on Acoustics, Speech and Signal Processing, Apr. 19, 2009, pp. 4.

Faller, et al., "Suppressing Acoustic Echo in a Spectral Envelope Space", Retrieved at <<http://infoscience.epfl.ch/record/54882/files/fallerchen05.pdf>>, IEEE Transactions on Speech and Audio Processing, Sep. 2005, pp. 15.

"Echo Cancellation", Retrieved at <<http://dea.brunel.ac.uk/cmsp/home_saeed_vaseghi/chapter16-echocancellation.pdf>>, May 1, 2006, pp. 20.

"Non-Final Office Action", U.S. Appl. No. 13/789,532, Feb. 10, 2015, 4 pages.

"Notice of Allowance", U.S. Appl. No. 13/889,229, Jan. 8, 2015, 7 pages.

"Notice of Allowance", U.S. Appl. No. 13/789,532, May 22, 2015, 4 pages.

\* cited by examiner

ECHO SUPPRESSION

RELATED APPLICATION

This application claims priority under 35 USC 119 or 365 to Great Britain Application No. 1223241.9 filed Dec. 21, 2012, the disclosure of which is incorporate in its entirety.

BACKGROUND

A device may have audio input apparatus that can be used to receive audio signals from the surrounding environment. The device may also have audio output apparatus that can be used to output audio signals to the surrounding environment. For example, a device may have one or more speakers for outputting audio signals and one or more microphones for receiving audio signals. Audio signals which are output from the speaker(s) of the device may be received as "echo" in the audio signal received by the microphone(s). It may be the case that this echo is not desired in the received audio signal. For example, the device may be a user device (such as a mobile phone, tablet, laptop, PC, etc) which is used in a communication event, such as an audio or video call, with another user device over a network. Far-end signals of the call may be output from the speaker at the user device and may be received as echo in the audio signals received by the microphone at the device. Such echo can be disturbing to users of the call, and the perceived quality of the call may be reduced due to the echo. In particular, the echo may cause interference for near-end audio signals which are intended to be received by the microphone and transmitted to the far-end in the call. Therefore echo cancellation and/or echo suppression may be applied to the received audio signals to thereby suppress the echo in the received audio signal. The power of the echo in the received audio signal may vary depending upon the arrangement of the user device. For example, the user device may be a mobile phone and in that case, the power of the echo in the received audio signal would normally be higher when the mobile phone is operating in a "hands-free" mode compared to when the mobile phone is not operating in a "hands-free" mode.

Echo cancellation (or "echo subtraction") techniques aim to estimate an echo signal included in the audio signal received at the microphone, based on knowledge of the audio signal which is output from the speaker. The estimate of the echo signal can then be subtracted from the received audio signal thereby removing at least some of the echo from the received audio signal. Echo suppression is used to apply frequency-dependent suppression to the received audio signal to thereby suppress the echo in the received audio signal. In order for echo suppression to be implemented effectively, an echo suppressor needs to have an accurate estimate of the power of the echo in the received audio signal.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

There is provided a method of suppressing echo in a received audio signal. As part of the echo suppression, an estimate of the echo power of the echo is determined using a power response which is determined from a Finite Impulse Response (FIR) filter that is adapted to approximate the impulse response of the echo path. That is, a Finite Impulse Response filter estimate $\hat{h}(t)$ is dynamically adapted in the time domain based on the outputted audio signal and the received audio signal to thereby model the impulse response of the echo path $h(t)$ of the echo in the received audio signal. At least one power response is determined from the filter estimate $\hat{h}(t)$. The power response(s) is(are) used to estimate the echo power of the echo in the received audio signal, and the estimated echo power is used to apply echo suppression to the received audio signal, thereby suppressing the echo in the received audio signal.

The method may be used in a call (e.g. a call implementing voice over internet protocol (VoIP) to transmit audio data between user devices) in which case the outputted audio signal may be a far-end signal received from the far-end of the call, and the received signal includes the resulting echo and a near-end signal for transmission to the far-end of the call.

DETAILED DESCRIPTION

In order for echo suppression to be implemented effectively, an echo suppressor needs to have an accurate estimate of the power of the echo in the received audio signal. As described herein, the echo power can be estimated using a power response based on an FIR filter that is adapted to approximate the impulse response of the echo path between a loudspeaker outputting audio signals and a microphone receiving audio signals including the echo resulting from the outputted audio signals.

The FIR filter might only be used to estimate the echo power (by determining a power response of the FIR filter and then estimating the echo power using the power response), and not to estimate the actual echo signal. This may be advantageous because the requirements for accuracy in the FIR filter are much less when used to estimate the echo power compared to if the FIR filter is used to estimate the actual echo signal. Therefore by estimating the echo power (rather than the echo signal) from the FIR filter, echo suppression is more robust to problems such as clock-drift between the playout (e.g. from a loudspeaker) and recording sides (e.g. at a microphone) in the VoIP client, nonlinearities in the echo path and changes in the echo path. In embodiments described herein, the FIR filter is adapted using time-domain data including phase information.

Figure 1:
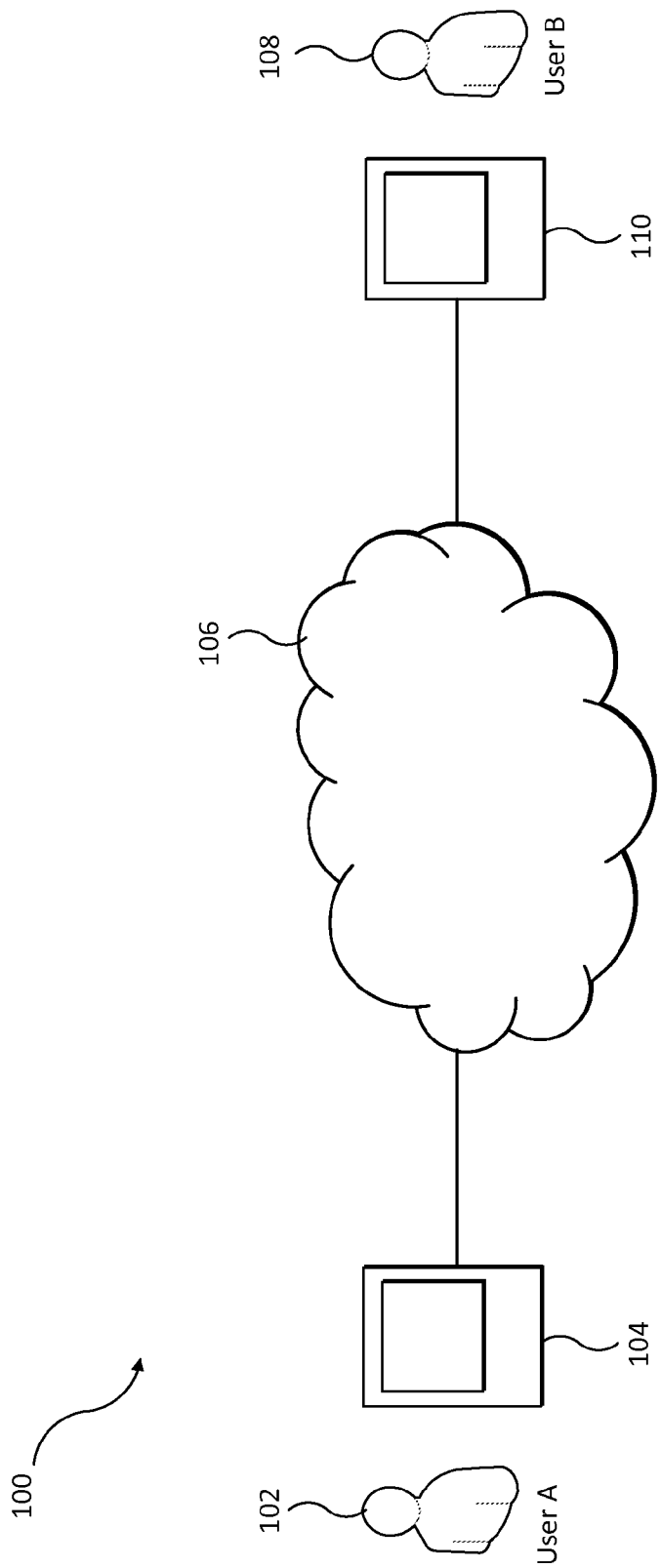
FIG. 1 shows a schematic illustration of a communication system in accordance with one or more embodiments.

FIG. 1 shows a communication system 100 comprising a first user 102 ("User A") who is associated with a first user device 104 and a second user 108 ("User B") who is associated with a second user device 110. In other embodiments the communication system 100 may comprise any number of users and associated user devices. The user devices 104 and 110 can communicate over the network 106 in the communication system 100, thereby allowing the users 102 and 108 to communicate with each other over the network 106. The communication system 100 shown in FIG. 1 is a packet-based communication system, but other types of communication system could be used. The network 106 may, for example, be the Internet. Each of the user devices 104 and 110 may be, for example, a mobile phone, a tablet, a laptop, a personal computer ("PC") (including, for example, Windows™, Mac OS™ and Linux™ PCs), a gaming device, a television, a personal digital assistant ("PDA") or other embedded device able to connect to the network 106. The user device 104 is arranged to receive information from and output information to the user 102 of the user device 104. The user device 104 comprises output means such as a display and speakers. The user device 104 also comprises input means such as a keypad, a touch-screen, a microphone for receiving audio signals and/or a camera for capturing images of a video signal. The user device 104 is connected to the network 106.

The user device 104 executes an instance of a communication client, provided by a software provider associated with the communication system 100. The communication client is a software program executed on a local processor in the user device 104. The client performs the processing required at the user device 104 in order for the user device 104 to transmit and receive data over the communication system 100.

The user device 110 corresponds to the user device 104 and executes, on a local processor, a communication client which corresponds to the communication client executed at the user device 104. The client at the user device 110 performs the processing required to allow the user 108 to communicate over the network 106 in the same way that the client at the user device 104 performs the processing required to allow the user 102 to communicate over the network 106. The user devices 104 and 110 are endpoints in the communication system 100. FIG. 1 shows only two users (102 and 108) and two user devices (104 and 110) for clarity, but many more users and user devices may be included in the communication system 100, and may communicate over the communication system 100 using respective communication clients executed on the respective user devices.

Figure 2:
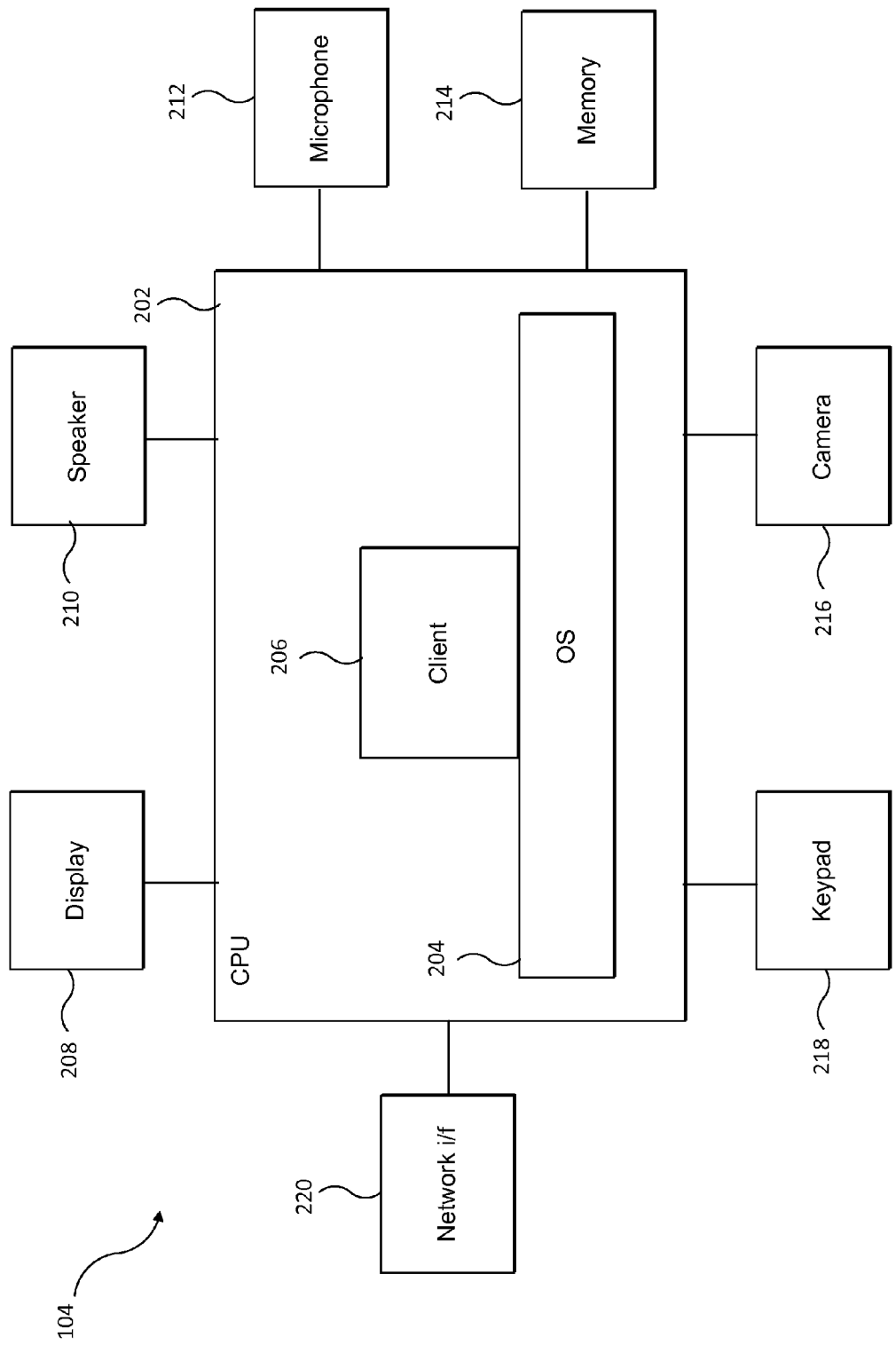
FIG. 2 is a schematic block diagram of a user device in accordance with one or more embodiments.

FIG. 2 illustrates a detailed view of the user device 104 on which is executed a communication client instance 206 for communicating over the communication system 100. The user device 104 comprises a central processing unit ("CPU") or "processing module" 202, to which is connected: output devices such as a display 208, which may be implemented as a touch-screen, and a speaker (or "loudspeaker") 210 for outputting audio signals; input devices such as a microphone 212 for receiving audio signals, a camera 216 for receiving image data, and a keypad 218; a memory 214 for storing data; and a network interface 220 such as a modem for communication with the network 106. The user device 104 may comprise other elements than those shown in FIG. 2. The display 208, speaker 210, microphone 212, memory 214, camera 216, keypad 218 and network interface 220 may be integrated into the user device 104 as shown in FIG. 2. In alternative user devices one or more of the display 208, speaker 210, microphone 212, memory 214, camera 216, keypad 218 and network interface 220 may not be integrated into the user device 104 and may be connected to the CPU 202 via respective interfaces. One example of such an interface is a USB interface. If the connection of the user device 104 to the network 106 via the network interface 220 is a wireless connection then the network interface 220 may include an antenna for wirelessly transmitting signals to the network 106 and wirelessly receiving signals from the network 106.

FIG. 2 also illustrates an operating system ("OS") 204 executed on the CPU 202. Running on top of the OS 204 is the software of the client instance 206 of the communication system 100. The operating system 204 manages the hardware resources of the computer and handles data being transmitted to and from the network 106 via the network interface 220. The client 206 communicates with the operating system 204 and manages the connections over the communication system. The client 206 has a client user interface which is used to present information to the user 102 and to receive information from the user 104. In this way, the client 206 performs the processing required to allow the user 102 to communicate over the communication system 100.

Figure 3:
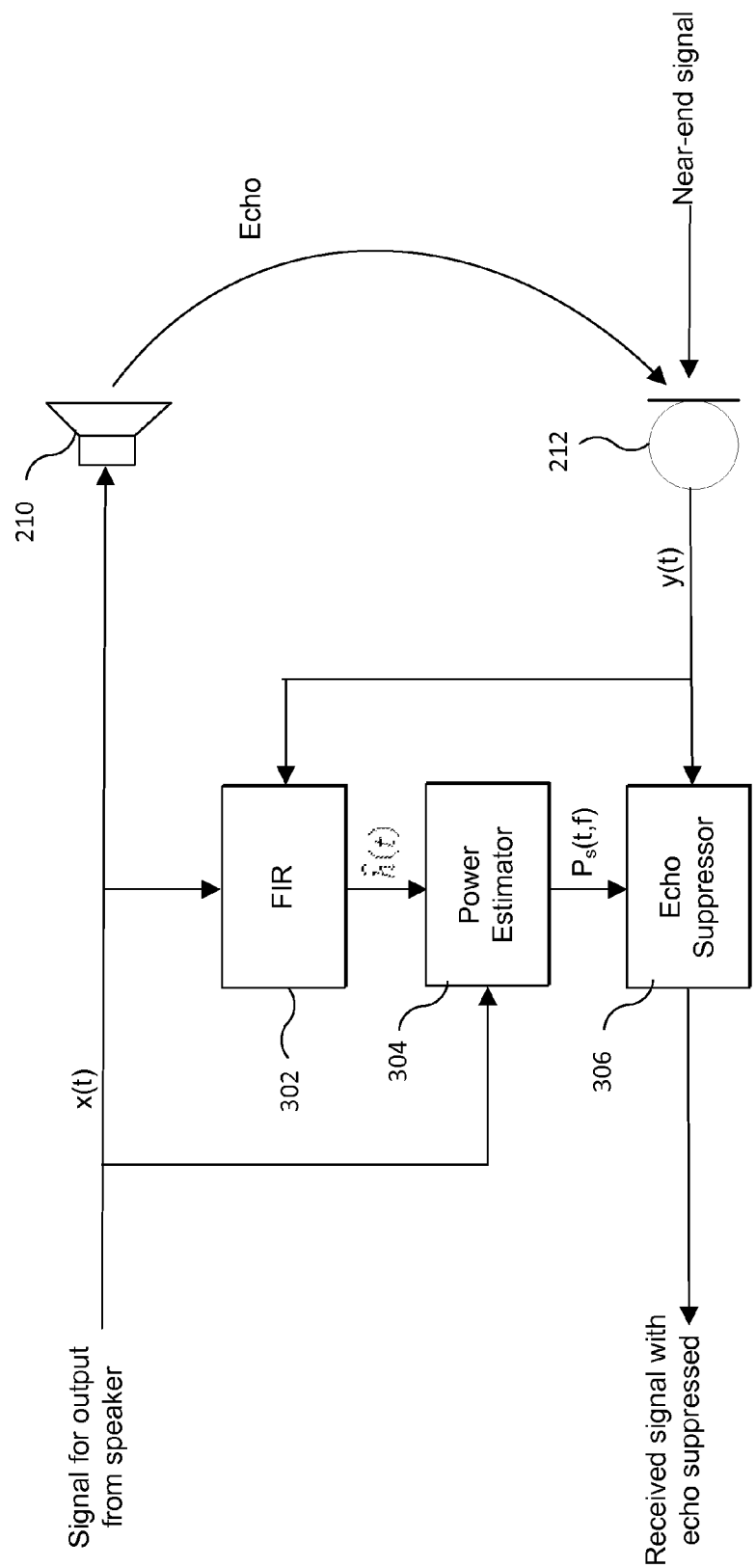
FIG. 3 is a functional diagram showing modules of a user device for use in echo suppression in accordance with one or more embodiments.
Figure 4:
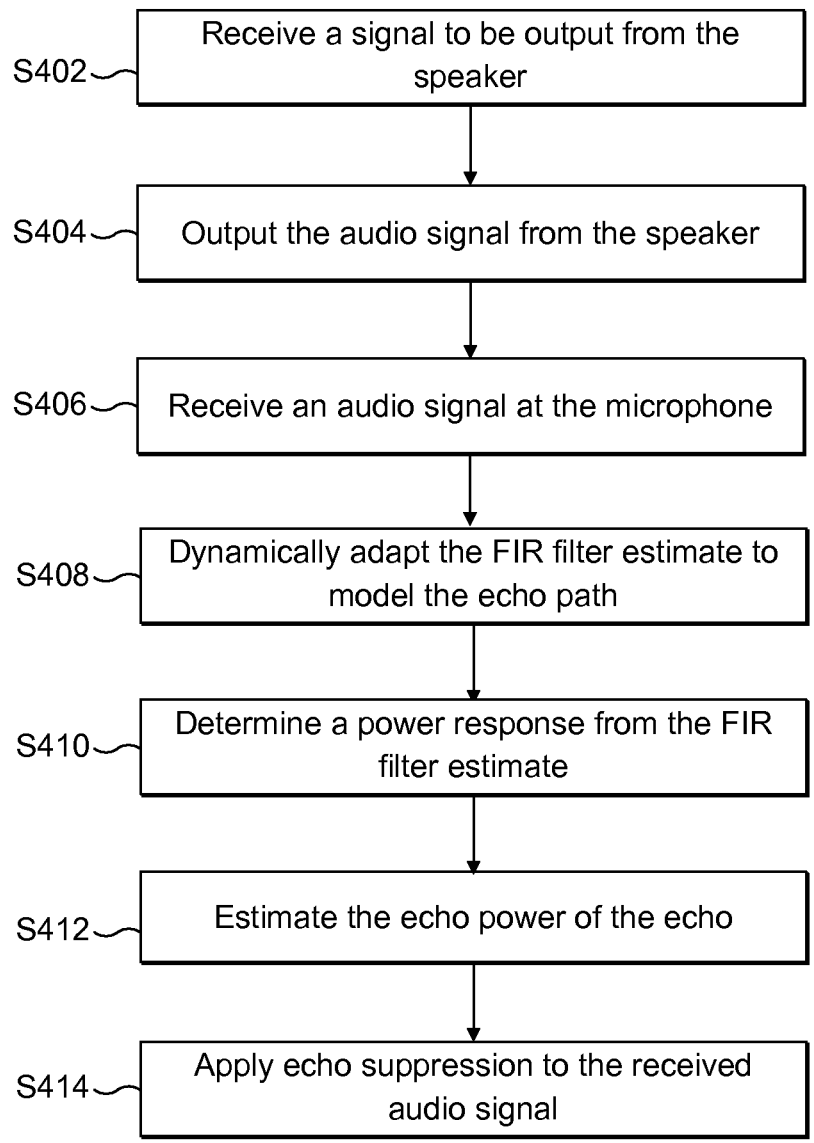
FIG. 4 is a flow chart for a process of suppressing echo in accordance with one or more embodiments.

With reference to FIGS. 3 and 4 there is now described a method of suppressing echo. FIG. 3 is a functional diagram of a part of the user device 104 showing how an echo suppression process is implemented, and FIG. 4 is a flow chart for the process of suppressing echo.

As shown in FIG. 3, the user device 104 comprises the speaker 210, the microphone 212, a FIR filter module 302, a power estimating module 304 and an echo suppression module 306. A signal x(t) to be output from the speaker 210 is coupled to an input of the speaker 210. It should be noted that in the embodiments described herein there is just one speaker (indicated by reference numeral 210 in the figures) but in other embodiments there may be more than one speaker to which the signal to be outputted is coupled (for outputting therefrom). Similarly, in the embodiments described herein there is just one microphone (indicated by reference numeral 212 in the figures) but in other embodiments there may be more than one microphone which receive audio signals from the surrounding environment. The signal to be output from the speaker 210 is also coupled to a first input of a FIR filter module 302 and to a first input of the power estimating module 304. An output of the microphone 212 is coupled to a second input of the FIR filter module 302 and to a first input of the echo suppression module 306. An output of the FIR filter module 302 is coupled to a second input of the power estimating module 304. An output of the power estimating module is coupled to a second input of the echo suppression module 306. An output of the echo suppression module 306 is used to provide the received signal (with echo suppression having been applied) for further processing in the user device 104.

In step S402 a signal is received which is to be outputted from the speaker 210. For example, the signal to be outputted may be a far-end signal that has been received at the user device 104 from the user device 110 during a call between the users 102 and 108 over the communication system 100. Any processing that is required to be performed on the received signal (e.g. decoding using a speech codec, depacketizing, etc) is performed as is known in the art (e.g. by the client 206) to arrive at the signal x(t) which is suitable to be outputted from the speaker 210. The signal x(t) is a digital signal. At least some of the processing of the signal in the user device 104 prior to outputting the signal from the speaker 210 is performed in the digital domain. As is known in the art, a digital to analogue converter (DAC) is applied to the digital signal x(t) before playout from the loudspeaker 210. Similarly, an analogue to digital converter (ADC) is applied to the signal captured by the microphone 212 to arrive at the digital signal y(t).

In other embodiments, the signal to be outputted may be received from somewhere other than over the communication system 100 in a call. For example, the signal to be outputted may have been stored in the memory 214 and step S402 may comprise retrieving the signal from the memory 214.

In step S404 the audio signal x(t) is outputted from the speaker 210. In this way the audio signal x(t) is outputted to the user 102.

In step S406 the microphone 212 receives an audio signal. As shown in FIG. 3 the received audio signal may include a near-end signal which is a desired signal or "primary signal". The near-end signal is the signal that the user 102 intends the microphone 212 to receive. However, the received audio signal also includes an echo signal resulting from the audio signals outputted from the speaker 210 in step S404. The received audio signal may also include noise, such as background noise. Therefore, the total received audio signal y(t) can be given by the sum of the near-end signal, the echo and the noise. The echo and the noise act as interference for the near-end signal.

The FIR filter module 302 takes as inputs the outputted audio signal x(t) and the received audio signal y(t). In step S408 the FIR filter module 302 dynamically adapts a FIR filter estimate $\hat{h}(t)$ in the time domain based on the outputted audio signal x(t) and the received audio signal y(t) to model an echo path h(t) of the echo in the received audio signal y(t). The "impulse response of the echo path h(t)" is also referred to herein as the "echo path h(t)".

For a fairly linear echo path, the echo path h(t) describes how the echo in the received audio signal relates to the audio signal x(t) output from the speaker 210, e.g. according to the equation $y^{echo}(t) = \sum_{n=0}^{N_{true}} h_n(t) x(t-n)$, where $y^{echo}(t)$ is the echo in the received audio signal y(t), $N_{true}$ is the number of samples of the outputted signal x(t) which are received by the microphone 212 and $h_n(t)$ are weights describing the echo path h(t). The echo path h(t) may vary in both time and frequency and may be referred to herein as h(t) or h(t,f). The echo path h(t) may depend upon (i) the current environmental conditions surrounding the speaker 210 and the microphone 212 (e.g. whether there are any physical obstructions to the passage of the audio signal from the speaker 210 to the microphone 212, the air pressure, temperature, wind, etc), and (ii) characteristics of the speaker 210 and/or the microphone 212 which may alter the signal as it is outputted and/or received.

The FIR filter module 302 models the echo path h(t) of the echo in the received audio signal by determining a weighted sum of the current and a finite number (N) of previous values of the outputted audio signal x(t). The FIR filter module 302 therefore implements an Nth order FIR filter which has a finite length (in time) over which it considers the values of the outputted audio signal x(t) in determining the estimate of the echo path $\hat{h}(t)$. In this way, the FIR filter module 302 dynamically adapts the FIR filter estimate $\hat{h}(t)$. The echo prediction operation is described by the following equation, which defines the echo in the received audio signal y(t) in terms of the outputted audio signal x(t):

$$\hat{y}^{echo}(t) = \sum_{n=0}^{N} \hat{h}_n(t) x(t-n).$$

Therefore N+1 samples of the outputted audio signal x(t) are used, with a respective N+1 weights $\hat{h}_n(t)$. The set of N+1 weights $\hat{h}_n(t)$ is referred to herein simply as the estimate of the echo path $\hat{h}(t)$. In other words the estimate of the echo path $\hat{h}(t)$ is a vector having N+1 values where the FIR filter module 302 implements an Nth order FIR filter, taking N+1 values (e.g. N+1 frames) of the signal x(t) into account.

It can be appreciated that it is easier to adapt the FIR filter estimate $\hat{h}(t)$ when the echo is a dominant part of the received audio signal, that is when $y(t) = y^{echo}(t)$. For example, in some embodiments it may be possible to detect when the power of the near-end signal is greater than the power of the echo (e.g. when the user 102 is speaking), and whilst that is the case the FIR estimate $\hat{h}(t)$ is not adapted, but when the power of the near-end signal is less than the power of the echo in the received audio signal y(t) (e.g. when the user 102 is not speaking) the FIR estimate $\hat{h}(t)$ is adapted.

However, it may be possible to adapt the FIR filter estimate $\hat{h}(t)$ even when the echo is not a dominant part of the received audio signal.

The FIR filter estimate $\hat{h}(t)$ is passed from the FIR filter module 302 to the power estimating module 304. In step S410 the power estimating module 304 determines at least one power response from the FIR filter estimate $\hat{h}(t)$. The power response information is determined by analysing the FIR filter estimate $\hat{h}(t)$. The power response (or "frequency response") gives an indication of the power response of the echo path h(t) as a function of frequency.

In step S412 the power estimating module 304 estimates the echo power of the echo in the received audio signal based on the determined power response(s) determined in step S410 and based on the input signal x(t). Steps S410 and S412 might not comprise estimating the echo signal $y^{echo}(t)$ in the received audio signal y(t). The echo power is estimated as a function of time and frequency. In echo suppression a rather low accuracy of the echo power estimate is sufficient to achieve good echo suppression. According to methods described herein the power response can be computed in a way that is less sensitive to problems. Furthermore, the power response can be estimated in a different way than the actual echo path would be estimated. For example, the power response for a frequency, f, may be computed using the estimate of the FIR filter for that frequency, f. Alternatively or additionally, the estimate of the FIR filter for the frequency, f, may be used to compute the power response for a different frequency, v, where v≠f. In other words, the method may include using an extrapolated echo path power response that is computed for another frequency region than the one where it is applied. In this sense, the power response is computed based on the FIR filter estimate, although some extrapolation may be required to determine the power response for a particular frequency. That is to say, an FIR filter estimate obtained for a certain frequency region may be used to compute a predicted (or extrapolated) power response estimate for another frequency region, i.e., the power response used to estimate the echo power is not necessary the power response of the FIR filter but could also be a power response (e.g. for a different frequency region) that is computed based on the FIR filter.

In particular, the FIR filter estimate $\hat{h}(t)$ has a length L in the time domain. Step S410 comprises partitioning the FIR filter estimate $\hat{h}(t)$ into a plurality (P) of partitions in the time domain of length L/P each. Each of the partitions of the FIR filter estimate $\hat{h}(t)$ is transformed into the frequency domain and squared to determine a respective power response $|\hat{H}_p(f)|^2$ in the frequency domain for each of the partitions. It can therefore be appreciated that $|\hat{H}_p(f)|^2$ is the frequency response of partition p.

Step S412 comprises estimating the echo power of the echo in the received audio signal by performing a weighted sum of a plurality of measures of the power of a respective plurality of frames of the outputted audio signal, wherein the weights in the sum are given by respective ones of the power responses $|\hat{H}_p(f)|^2$.

Therefore, the estimate of the echo power $\hat{P}_s(k, f)$ of the echo in the received audio signal, for a frame k, can be estimated in step S412 according to the equation:

$$\hat{P}_s(k,f) = \sum_{p=0}^{P-1} |\hat{H}_p(f)|^2 |X(k-p,f)|^2,$$

where $|X(k-p, f)|^2$ is the power spectral density of the loudspeaker signal for frame k−p. The frame index k is a measure of the time, and as such $\hat{P}_s(k, f)$ can be rewritten to be a function of time rather than of frame indices, to give the estimate $\hat{P}_s(t, f)$ of the echo power. Note that in order for the above equation to be correct, the lengths of the filter partitions and loudspeaker signals used to compute $|\hat{H}_p(f)|^2$ and $|X(k-p, f)|^2$ should be carefully selected in order to minimize circular convolution effects. This selection is performed to ensure that the lengths of the partition of h and the loudspeaker input signal frame are properly matched to the length of the microphone signal used to adapt the filter estimate h, and for which the echo power is to be estimated. If each partition is of length P, each loudspeaker (X) frame length is M, and each microphone signal frame length is N, the typical requirement to being able to avoid circular convolution effects is that N+P−1<M. Although this selection is preferable, the methods described herein will work regardless of the selection because circular convolution effects are ignored in the methods.

In this way, the FIR filter estimate ĥ(t), that has been adapted using the speaker and microphone signals x(t) and y(t) to approximate the time-varying echo path h(t) of the VoIP client, is used to determine the power responses $|\hat{H}_p(f)|^2$ which are then used, with the outputted audio signals x(t), to estimate the power $P_s(t, f)$ of the echo signal at time t and frequency f.

The estimate $\hat{P}_s(t, f)$ of the echo power is output from the power estimating module 304 and received by the echo suppression module 306. The echo suppression module 306 also receives the audio signal y(t) from the microphone 212. In step S412 the echo suppression module 306 uses the estimate $\hat{P}_s(t, f)$ of the echo power to apply echo suppression to the received audio signal y(t), thereby suppressing the echo in the received audio signal.

The estimate $\hat{P}_s(t, f)$ of the echo power is frequency dependent and the suppression applied by the echo suppression module 306 is also frequency dependent.

The purpose of the echo suppressor is to suppress the loudspeaker echo present in the microphone signal, e.g. in a VoIP client, to a level sufficiently low for it not to be noticeable/disturbing in the presence of the near-end sounds (non-echo sounds) picked up by the microphone 212. In order to be able to choose the proper amount of echo suppression a good estimate of the echo power (e.g. as a function of frequency and time) is needed, and as described above this is provided to the echo suppression module 306 by the power estimating module 304. The echo suppression module 306 is designed to apply signal dependent suppression that varies both over time and frequency to the received audio signal y(t). Echo suppression methods are known in the art. Furthermore, the echo suppression method applied by the echo suppression module 306 may be implemented in different ways. As such, the exact details of the echo suppression method are therefore not described in detail herein.

The echo suppression module 306 outputs the received signal, with the echo having been suppressed, for further processing at the user device 104. For example, the signal output from the echo suppression module 306 may be processed by the client 206 (e.g. encoded and packetized) and then transmitted over the network 106 to the user device 110 in a call between the users 102 and 108. Additionally or alternatively, the signal output from the echo suppression module 306 may be used for other purposes by the user device 104, e.g. the signal may be stored in the memory 214 or used as an input to an application which is executing at the user device 104.

There is therefore described herein the use of power response information obtained by analysing the FIR filter that has been adapted in the time-domain, to model the power of the echo signal in frequency bands for the purpose of computing and applying an echo suppression effect/filter (e.g. for use by the VoIP client 206).

In the embodiments described above, the echo suppression is implemented in a VoIP system (e.g. the received audio signal may include speech of the user 102 for transmission to the user device 110 during a call between the users 102 and 108 over the communication system 100). However, the echo suppression methods described herein can be applied in any suitable system in which echo suppression is to be applied.

In the embodiments described above, and shown in the Figures, echo cancellation (or "echo subtraction") is not applied to the received audio signal y(t). That is, there is no echo cancellation module in the user device 104 and the echo suppression is applied to the received audio signal y(t) without a prior step of applying echo cancellation to the received audio signal y(t).

However, in other embodiments, echo cancellation may be applied, by an echo cancellation module, to the received audio signal y(t). In particular, the echo suppression applied by the echo suppression module 306 may be applied downstream of (i.e. after) the echo cancellation in the processing of the received audio signal y(t). The echo cancellation module would subtract an estimate of the echo signal from the received audio signal, but due to inaccuracies in the estimate of the echo signal, a residual echo would most-likely remain in the received audio signal. It is the residual echo that would then be suppressed by the echo suppression module 306. This echo suppression could be applied in the same way as described herein in the embodiments in which no echo cancellation is applied. If echo subtraction is used, the effect of it can be taken into account in the echo suppression.

The methods described herein may be implemented by executing a computer program product (e.g. the client 206) at the user device 104. That is, a computer program product may be configured to suppress echo in the received audio signal y(t), wherein the computer program product is embodied on a computer-readable storage medium (e.g. stored in the memory 214) and configured so as when executed on the CPU 202 to perform the operations of any of the methods described herein.

Generally, any of the functions described herein (e.g. the functional modules shown in FIG. 3 and the functional steps shown in FIG. 4) can be implemented using software, firmware, hardware (e.g., fixed logic circuitry), or a combination of these implementations. The modules and steps shown separately in FIGS. 3 and 4 may or may not be implemented as separate modules or steps. For example, the echo suppression module 306 may perform the function of the power estimating module 304, such that a separate power estimating module 304 is not required in addition to the echo suppression module 306. The terms "module," "functionality," "component" and "logic" as used herein generally represent software, firmware, hardware, or a combination thereof. In the case of a software implementation, the module, functionality, or logic represents program code that performs specified tasks when executed on a processor (e.g. CPU or CPUs). The program code can be stored in one or more computer readable memory devices. The features of the techniques described herein are platform-independent, meaning that the techniques may be implemented on a variety of commercial computing platforms having a variety of processors.

For example, the user devices may also include an entity (e.g. software) that causes hardware of the user devices to perform operations, e.g., processors functional blocks, and so on. For example, the user devices may include a computer-readable medium that may be configured to maintain instructions that cause the user devices, and more particularly the operating system and associated hardware of the user devices to perform operations. Thus, the instructions function to configure the operating system and associated hardware to perform the operations and in this way result in transformation of the operating system and associated hardware to perform functions. The instructions may be provided by the computer-readable medium to the user devices through a variety of different configurations.

One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may us magnetic, optical, and other techniques to store instructions and other data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of suppressing echo, the method comprising:
outputting an audio signal;
receiving an audio signal, wherein the received audio signal includes an echo resulting from said outputted audio signal;
dynamically adapting a Finite Impulse Response filter estimate $\hat{h}(t)$ in the time domain based on the outputted audio signal and the received audio signal to model an echo path h(t) of the echo in the received audio signal;
determining at least one power response from the filter estimate $\hat{h}(t)$;
using the determined at least one power response to estimate the echo power of the echo in the received audio signal; and
using the estimated echo power to apply echo suppression to the received audio signal, thereby suppressing the echo in the received audio signal.

2. The method of claim 1 wherein said at least one power response comprises a plurality of power responses and said determining a plurality of power responses comprises:
partitioning the determined filter estimate $\hat{h}(t)$ into a plurality of P partitions in the time domain; and
transforming and squaring each of the partitions of the filter estimate $\hat{h}(t)$ to determine a respective power response $|\hat{H}_p(f)|^2$ in the frequency domain for each of the partitions.

3. The method of claim 2 wherein the echo power of the echo in the received audio signal is estimated by performing a weighted sum of a plurality of measures of the power of a respective plurality of frames of the outputted audio signal, wherein the weights in the sum are given by respective ones of the power responses $|\hat{H}_p(f)|^2$.

4. The method of claim 3 wherein the echo power $P_s(k,f)$ of the echo in the received audio signal, for a frame k, is estimated according to the equation:

$$\hat{P}_s(k,f) = \Sigma_{p=0}^{P-1} |\hat{H}_p(f)|^2 |X(k-p,f)|^2,$$

where $|X(k-p,f)|^2$ is the power spectral density of the outputted signal for frame k−p.

5. The method of claim 2 wherein the filter estimate has a length L in the time domain and each of the P partitions has a length L/P in the time domain.

6. The method of claim 1 wherein said echo suppression is applied to the received audio signal without a prior step of applying echo cancellation to the received audio signal.

7. The method of claim 1 wherein said step of using the at least one determined power response to estimate the echo power of the echo does not comprise estimating a signal of the echo in the received audio signal.

8. The method of claim 1 further comprising applying echo cancellation to the received audio signal, wherein said echo suppression is applied downstream of the echo cancellation in the processing of the received audio signal.

9. The method of claim 1 wherein said echo suppression which is applied to the received audio signal is signal dependent suppression that varies over time and frequency.

10. The method of claim 1 wherein the method is performed at a user device for use in a communication event, and wherein the received audio signal comprises speech of a user for transmission from the user device in the communication event.

11. The method of claim 10 wherein the communication event is a voice-over-internet-protocol (VoIP) call.

12. The method of claim 11 wherein the outputted audio signal comprises far-end speech signals of the VoIP call which are included in the echo in the received audio signal.

13. A device configured to implement echo suppression, the device comprising:
audio output apparatus configured to output an audio signal;
audio input apparatus configured to receive an audio signal, wherein the received audio signal includes an echo resulting from said outputted audio signal;
a filter estimating module configured to dynamically adapt a Finite Impulse Response filter estimate $\hat{h}(t)$ in the time domain based on the outputted audio signal and the received audio signal to model an echo path h(t) of the echo in the received audio signal;
a power estimating module configured to determine at least one power response from the filter estimate $\hat{h}(t)$ and to use the determined at least one power response to estimate the echo power of the echo in the received audio signal; and
an echo suppression module configured to use the estimated echo power to apply echo suppression to the received audio signal, thereby suppressing the echo in the received audio signal.

14. The device of claim 13 wherein the audio output apparatus comprises a speaker configured to output the outputted audio signal, and wherein the audio input apparatus comprises a microphone configured to receive the received audio signal.

15. The device of claim 13 wherein the device does not comprise an echo cancellation module configured to apply echo cancellation to the received audio signal.

16. The device of claim 13 further comprising an echo cancellation module configured to apply echo cancellation to the received audio signal, wherein said echo suppression module is arranged to be applied downstream of the echo cancellation module in the processing of the received audio signal.

17. The device of claim 13 wherein said at least one power response comprises a plurality of power responses and wherein said power estimating module is configured to determine the plurality of power responses from the determined filter estimate $\hat{h}(t)$ by:
partitioning the filter estimate $\hat{h}(t)$ into a plurality of P partitions in the time domain; and transforming and squaring each of the partitions of the filter estimate $\hat{h}(t)$ to determine a respective power response $|\hat{H}_p(f)|^2$ in the frequency domain for each of the partitions.

18. The device of claim 17 wherein said power estimating module is configured to estimate the echo power $P_s(k, f)$ of the echo in the received audio signal, for a frame k, according to the equation:

$$\hat{P}_s(k,f)=\Sigma_{p=0}^{P-1}|\hat{H}_p(f)|^2|X(k-p,f)|^2,$$

where $|X(k-p,f)|^2$ is the power spectral density of the outputted signal for frame k−p.

19. The device of claim 17 wherein the filter estimate has a length L in the time domain and each of the P partitions has a length L/P in the time domain.

20. A computer program product configured to suppress echo in a received audio signal, the computer program product being embodied on one or more computer-readable memory storage hardware devices and configured to, responsive to execution by at least one processor, perform operations comprising:

outputting an audio signal;

receiving an audio signal, wherein the received audio signal includes an echo resulting from said outputted audio signal;

dynamically adapting a Finite Impulse Response filter estimate $\hat{h}(t)$ in the time domain based on the outputted audio signal and the received audio signal to model an echo path h(t) of the echo in the received audio signal;

determining at least one power response from the filter estimate $\hat{h}(t)$;

using the determined at least one power response to estimate the echo power of the echo in the received audio signal; and using the estimated echo power to apply echo suppression to the received audio signal, thereby suppressing the echo in the received audio signal.

* * * * *